(12) United States Patent
Hagi

(10) Patent No.: US 11,762,003 B2
(45) Date of Patent: Sep. 19, 2023

(54) ENVIRONMENT FORMING APPARATUS, PROGRAM, AND METHOD FOR CONTROLLING BLOWER FAN

(71) Applicant: ESPEC CORP., Osaka (JP)

(72) Inventor: Keiyu Hagi, Osaka (JP)

(73) Assignee: ESPEC CORP., Osaka (JP)

( * ) Notice: Subject to any disclaimer, the term of this patent is extended or adjusted under 35 U.S.C. 154(b) by 0 days.

(21) Appl. No.: 17/706,098

(22) Filed: Mar. 28, 2022

(65) Prior Publication Data

US 2022/0365124 A1 Nov. 17, 2022

(30) Foreign Application Priority Data

May 13, 2021 (JP) .................................. 2021-081496

(51) Int. Cl.
*G01R 31/00* (2006.01)

(52) U.S. Cl.
CPC .................................. *G01R 31/003* (2013.01)

(58) Field of Classification Search
CPC .... G01R 31/003; Y02B 30/70; G01N 17/002; F25D 17/06; F25D 31/005; G05D 23/1928
USPC ..................................................... 324/750.08
See application file for complete search history.

(56) References Cited

U.S. PATENT DOCUMENTS

| 2014/0021974 A1* | 1/2014 | Suyama | ............. | G01R 31/2619 324/750.03 |
|---|---|---|---|---|
| 2021/0285679 A1 | 9/2021 | Tanaka | | |

FOREIGN PATENT DOCUMENTS

| JP | 2010-019440 A | 1/2010 |
|---|---|---|
| JP | 2014-115205 A | 6/2014 |
| JP | 2015-064250 A | 4/2015 |
| JP | 2018-105786 A | 7/2018 |
| JP | 2020-165670 A | 10/2020 |
| JP | WO2020/065844 A1 | 5/2021 |

OTHER PUBLICATIONS

The extended European search report issued by the European Patent Office dated Oct. 31, 2022, which corresponds to European Patent Application No. 22164611.0-1001 and is related to U.S. Appl. No. 17/706,098.
An Official Communication regarding Observations by a third party mailed by the Japanese Patent Office dated Jun. 27, 2023, which corresponds to Japanese Patent Applicaiton No. 2021-081496 and is related to U.S. Appl. No. 17/706,098; with a partial English translation.

* cited by examiner

*Primary Examiner* — Farhana A Hoque
(74) *Attorney, Agent, or Firm* — Studebaker & Brackett PC

(57) ABSTRACT

An environmental testing apparatus includes: a plurality of blower fans that circulate air-conditioned air between an air conditioning chamber and a test chamber; a plurality of temperature sensors that measure temperature at a plurality of locations in the test chamber and output temperature data; and a control unit that can individually set rotation speed of each blower fan. The control unit executes setting processing for setting the rotation speed of each blower fan in a testing period in a setting period before the testing period. In the setting processing, the control unit changes the rotation speed of the plurality of blower fans a plurality of times, and acquires a plurality of temperature data after each change from the plurality of temperature sensors.

11 Claims, 10 Drawing Sheets

FIG.1
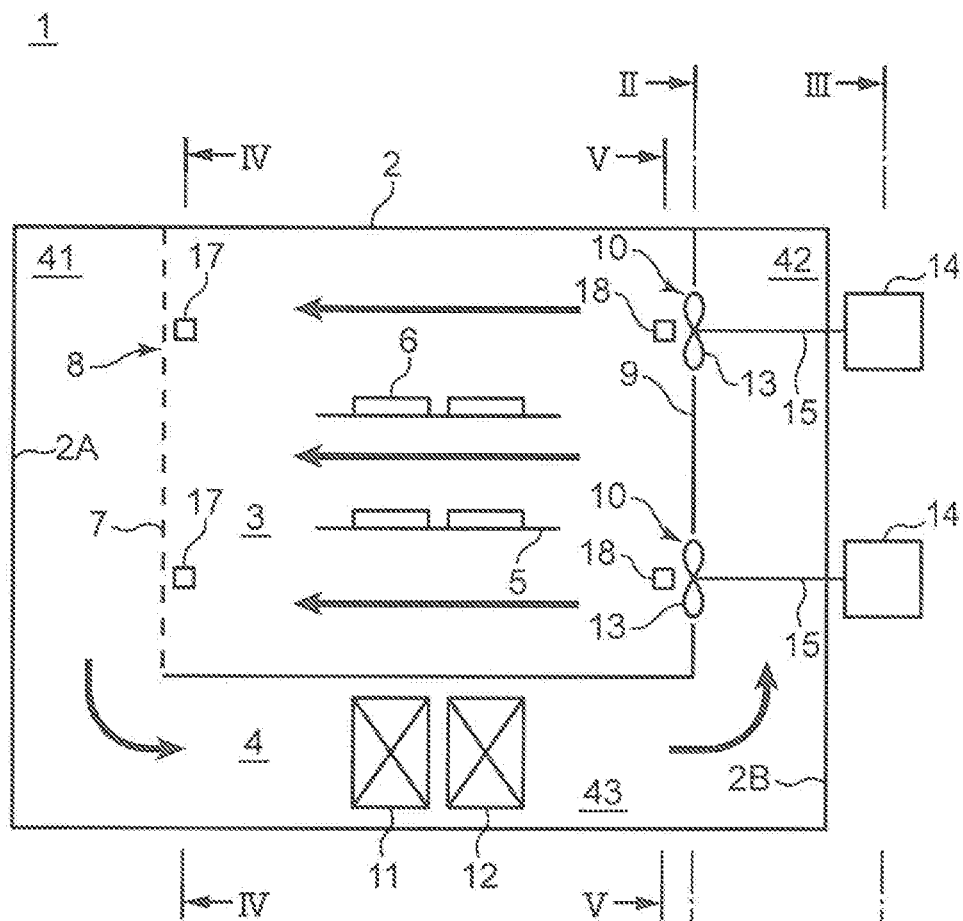
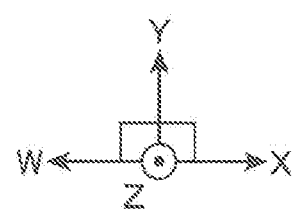

FIG.12
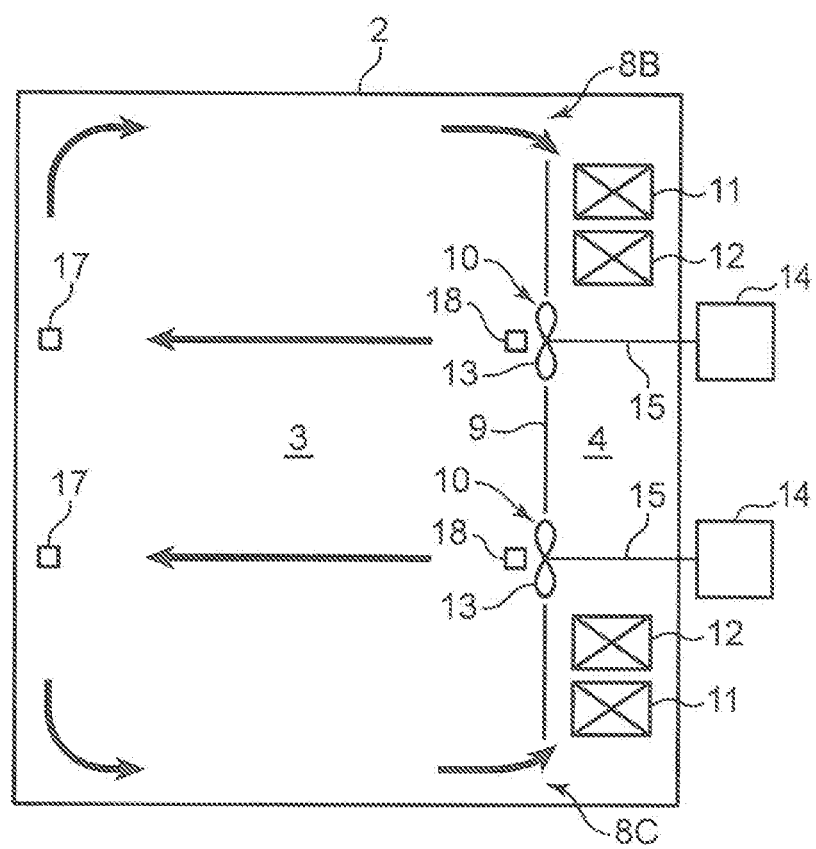
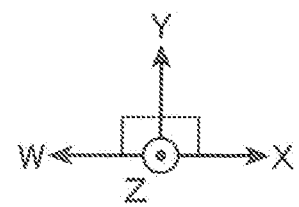

ENVIRONMENT FORMING APPARATUS, PROGRAM, AND METHOD FOR CONTROLLING BLOWER FAN

CROSS REFERENCE TO RELATED APPLICATIONS

The present application is based on, and claims priority from Japanese Patent Application Serial Number 2021-081496, the disclosure of which is hereby incorporated by reference herein in its entirety.

BACKGROUND

Technical Field

The present invention relates to an environment forming apparatus, a program, and a method for controlling a blower fan.

Related Art

As a test for evaluating performance or the like of a test object such as an electronic component, an environmental testing is known. In the environmental testing, performance or the like of the test object is evaluated by applying environmental stress such as temperature to the test object accommodated in a test chamber. An environmental testing apparatus is known as an apparatus for conducting an environmental testing. For example, as presented in JP 2014-115205 A, an environmental testing apparatus according to the background art includes a test chamber surrounded by a heat-insulating housing, an air conditioning chamber communicating with the test chamber, an air conditioner such as a heater and a cooler disposed in the air conditioning chamber, and a blower that sends air-conditioned air generated by the air conditioner from the air conditioning chamber to the test chamber. As the blower, one blower fan is disposed so as to be positioned on one side wall side of the test chamber.

Some of the environmental testing apparatuses according to the above background art include one blower fan disposed in a substantially center part of a side wall. In such an environmental testing apparatus, an amount of air sent to a periphery of an internal space of the test chamber becomes relatively smaller than an amount of air sent to the center part. Therefore, there has been a case where a temperature difference occurs in the internal space of the test chamber between the periphery and the center part. When a plurality of test objects are accommodated side by side in the test chamber, the air-conditioned air sent from the blower is sometimes blocked by an upstream test object and hardly reaches a downstream test object. There has been a case where a temperature difference occurs in the internal space of the test chamber between the upstream side and the downstream side of the air blowing path. As described above, according to the environmental testing apparatus according to the above background art, there has been a case where unintended variation occurs in the temperature distribution in the internal space of the test chamber due to various factors.

SUMMARY

An object of the present disclosure is to provide an environment forming apparatus, a program, and a method for controlling a blower fan that can eliminate or reduce variations in environmental elements in an environment forming chamber.

An environment forming apparatus according to one aspect of the present disclosure includes: an environment forming chamber in which an object for which processing is to be executed is accommodated; an air conditioning chamber that communicates with the environment forming chamber; an air conditioning unit that is disposed in the air conditioning chamber and generates air-conditioned air by adjusting an environmental element of air; a plurality of blower fans that circulate the air-conditioned air between the air conditioning chamber and the environment forming chamber; a plurality of measurement units that measure the environmental element at a plurality of locations in the environment forming chamber and output a plurality of measurement values; and a setting unit that is capable of individually setting rotation speed of each blower fan of the plurality of blower fans, in which the setting unit changes rotation speed of the plurality of blower fans a plurality of times and acquires the plurality of measurement values after each change in a setting period before a processing period in which the processing is executed, and executes setting processing for setting rotation speed of the each blower fan in the processing period based on the plurality of measurement values.

BRIEF DESCRIPTION OF DRAWINGS

FIG. 1 is a view schematically showing a configuration of an environment forming apparatus according to an embodiment of the present invention;

FIG. 12 is a view schematically showing a configuration of the environment forming apparatus according to the modification.

DETAILED DESCRIPTION

Figure 2:
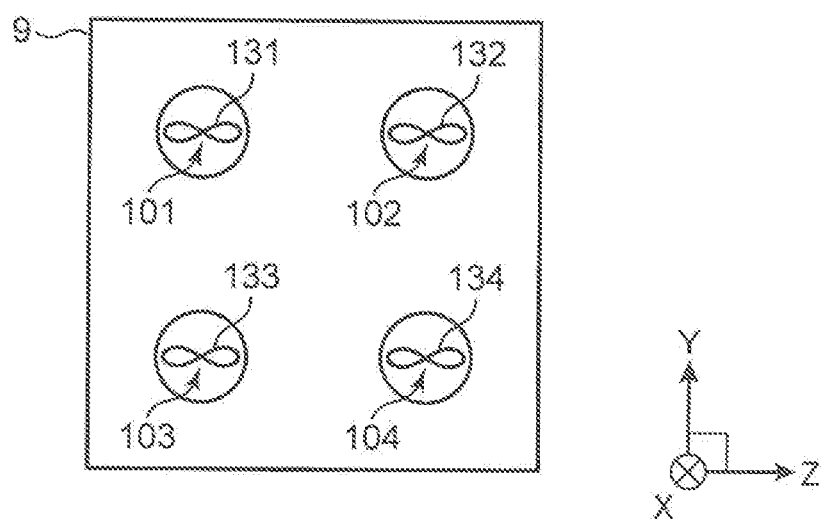
FIG. 2 is a view schematically showing an arrangement layout of a plurality of blower fans.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

Hereinafter, embodiments of the present invention will be described in detail with reference to the drawings. The elements with the same reference numerals in different drawings indicate the same or corresponding elements.

Configuration of Apparatus

FIG. 1 is a view schematically showing the configuration of the environment forming apparatus according to an embodiment of the present invention. In the example of the present embodiment, the environment forming apparatus is configured as an environmental testing apparatus 1 for evaluating the performance and the like of a test object 6 by applying a predetermined temperature stress to the test object 6, which is an object. However, the environmental testing apparatus 1 may be configured as a temperature and humidity testing apparatus that applies a predetermined temperature stress and humidity stress to the test object 6 by additionally mounting a humidifier. The environmental testing apparatus 1 may be configured as a burn-in testing apparatus for screening for an initial faulty product by applying a predetermined temperature stress and voltage stress to the test object 6. The test object 6 is, for example, an electronic component such as a circuit board. In the following description, as shown in FIG. 1, directions are partitioned by an orthogonal coordinate system having an X axis extending along the horizontal direction, a Y axis extending along the vertical direction, and a Z axis orthogonal to both the X axis and the Y axis. The orthogonal coordinate system shown in FIG. 1 shows a W axis extending in a direction opposite to the extending direction of the X axis.

The environmental testing apparatus 1 includes a test chamber 3 (environment forming chamber) surrounded by a heat-insulating housing 2 and an air conditioning chamber 4. The test chamber 3 has a first wall surface 7 and a second wall surface 9 opposing each other. The air conditioning chamber 4 has a first space section 41 partitioned by the first wall surface 7 and an inner surface 2A of the housing 2, a second space section 42 partitioned by the second wall surface 9 and an inner surface 2B of the housing 2, and a connection space section 43 connecting the first space section 41 and the second space section 42. A plurality of vents 8 are formed on the first wall surface 7, and a plurality of vents 10 are formed on the second wall surface 9. The test chamber 3 and the air conditioning chamber 4 communicate with each other through the plurality of vents 8 and 10. The first wall surface 7 on which the plurality of vents 8 are formed may be omitted, and in that case, the inner surface 2A of the housing 2 is the first wall surface of the test chamber 3. The first wall surface 7 or the inner surface 2A may be an inner surface of a door for accessing the test chamber 3 from the outside, and in that case, the inner surface of the door is the first wall surface of the test chamber 3.

In the test chamber 3, a shelf plate 5 is installed. The shelf plate 5 has a grid-like external shape where a plurality of rod-shaped members are cross-arrayed. The test object 6 is placed on shelf plate 5. In the example shown in FIG. 1, the shelf plates 5 are installed in a plurality of tiers in the test chamber 3, and a plurality of the test objects 6 are placed side by side on each shelf plate 5, whereby the plurality of test objects 6 are accommodated in the center part of the internal space of the test chamber 3. However, the number of tiers of the shelf plate 5 installed in the test chamber 3 only has to be one or more, and the number of the test objects 6 placed on each shelf plate 5 only has to be one or more. The test object 6 may be directly placed on the floor surface of the test chamber 3 without the shelf plate 5.

A cooler 11 as a cooling device and a heater 12 as a heating device are disposed in the connection space section 43 of the air conditioning chamber 4. The cooler 11 and the heater 12 function as air-conditioning units, and generate air-conditioned air adjusted to a desired temperature by cooling or heating the air flowing into the air conditioning chamber 4 from the test chamber 3 via the vent 8 of the first wall surface 7. The air conditioning temperatures of the cooler 11 and the heater 12 are controlled by a control unit 30 described later.

A plurality of temperature sensors 17 and 18 described later are disposed in the test chamber 3.

A plurality of blower fans 13 are disposed on the second wall surface 9 side of the test chamber 3. The blower fan 13 is configured as an axial fan having a direct-current motor 14 and a plurality of blades fixed to a tip end part of a rotating shaft 15 of the direct-current motor 14. The direct-current motor 14 is disposed outside the housing 2. The rotating shaft 15 penetrates the outer wall of the housing 2 and extends in the air conditioning chamber 4 along the W direction toward the test chamber 3. The tip end part of the rotating shaft 15 is disposed at a position concentric with the center of the vent 10 on the second wall surface 9. The blades of the blower fan 13 are disposed in the same plane as the vent 10. When the direct-current motor 14 is driven and the blower fan 13 rotates, air-conditioned air is sent from the air conditioning chamber 4 into the test chamber 3 through the vent 10. Since the blades of the blower fan 13 rotate in the Y-Z plane, the air-conditioned air sent into the test chamber 3 by the blower fan 13 travels substantially toward the W direction as indicated by a thick straight arrow in FIG. 1, passes through the test chamber 3, and then is exhausted from the vent 8 of the first wall surface 7 to the air conditioning chamber 4.

FIG. 2 is a view schematically showing the arrangement layout of the plurality of blower fans 13, and corresponds to a plan view in which a position along the line II-II shown in FIG. 1 is viewed in the X direction. In the example of the present embodiment, the environmental testing apparatus 1 includes a total of four blower fans 131 to 134 where two blower fans 13 are arranged to be separated from each other along each of the Y direction and the Z direction, and are arrayed in a matrix of 2 rows×2 columns. The blower fans 131 to 134 are dispersedly arranged over the entire region of the second wall surface 9. The rotation speed of each of the blower fans 131 to 134 is individually controlled by the control unit 30 described later.

On the second wall surface 9, the plurality of vents 10 are formed in the same number and in the same layout as the plurality of blower fans 13. In the example of the present embodiment, a total of four circular vents 101 to 104 are formed in a matrix of 2 rows×2 columns. Each of the vents 101 to 104 is formed at a position where the center of the circle is concentric with the rotating shaft 15 of each of the blower fans 131 to 134.

Figure 3:
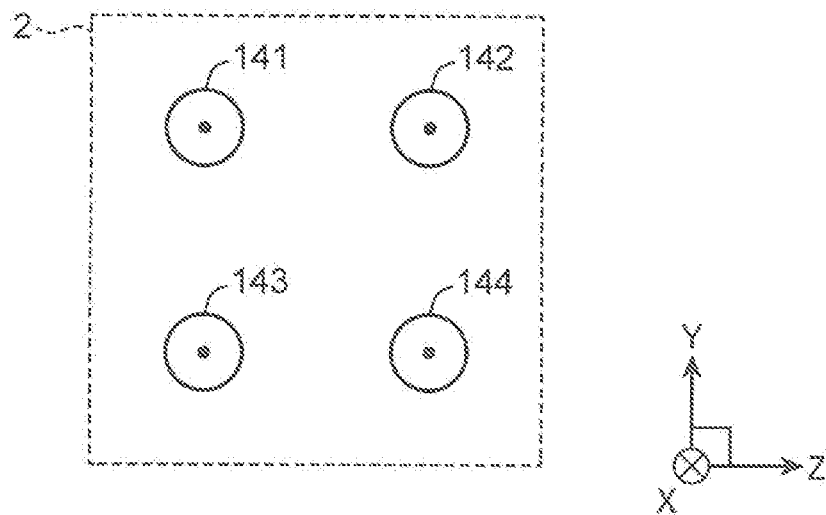
FIG. 3 is a view schematically showing an arrangement layout of a plurality of direct-current motors.

FIG. 3 is a view schematically showing the arrangement layout of the plurality of direct-current motors 14, and corresponds to a plan view in which a position along the line shown in FIG. 1 is viewed in the X direction. In the example of the present embodiment, a total of four direct-current motors 141 to 144 are arranged in a matrix of 2 rows×2 columns.

As shown in FIG. 1, the plurality of temperature sensors 17 are arranged in proximity to the first wall surface 7 of the test chamber 3. Since the first wall surface 7 is positioned on the most downstream of the blowing path of the air-conditioned air by the blower fan 13, the temperature sensor 17 measures the temperature (environmental element) of the air in the test chamber 3 on the most downstream.

Figure 4:
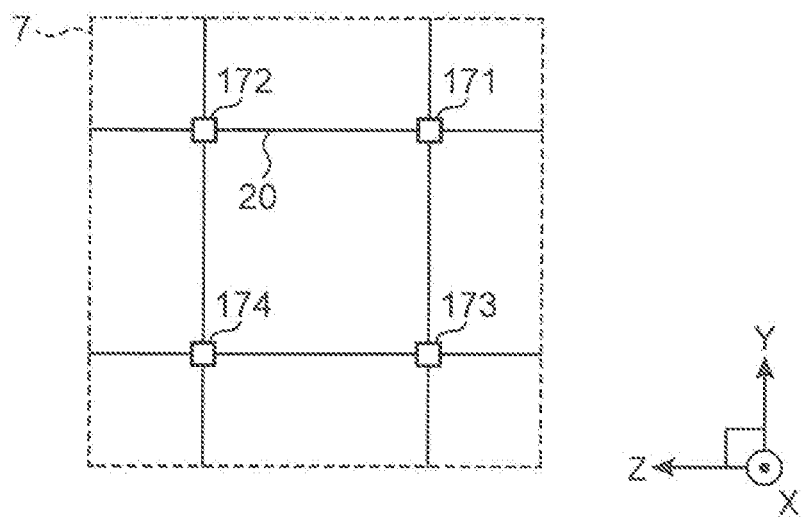
FIG. 4 is a view schematically showing an arrangement layout of a plurality of temperature sensors.

FIG. 4 is a view schematically showing the arrangement layout of the plurality of temperature sensors 17, and corresponds to a plan view in which a position along the line IV-IV shown in FIG. 1 is viewed in the W direction. The plurality of temperature sensors 17 are arranged in the same number and in the same layout as the plurality of blower fans 13. In the example of the present embodiment, a total of four temperature sensors 171 to 174 are arranged in a matrix of 2 rows×2 columns. Temperature data indicating the temperature measurement value output from each of the temperature sensors 171 to 174 is input to the control unit 30 described later. The temperature sensors 171 to 174 are arranged at each intersection of a grid-like frame 20 in which a plurality of rod-shaped members are cross-arrayed. This frame 20 is fixed to the inner wall of the test chamber 3 in proximity to the first wall surface 7. As shown in FIG. 1, each of the temperature sensors 171 to 174 are arranged on an extension line of the rotating shaft 15 of the corresponding blower fans 131 to 134.

As shown in FIG. 1, the plurality of temperature sensors 18 are arranged in proximity to the second wall surface 9 of the test chamber 3. The temperature sensor 18 is disposed in proximity to the blower fan 13. Since the second wall surface 9 is positioned on the most upstream of the blowing path of the air-conditioned air by the blower fan 13, the temperature sensor 18 measures the temperature of the air in the test chamber 3 on the most upstream.

Figure 5:
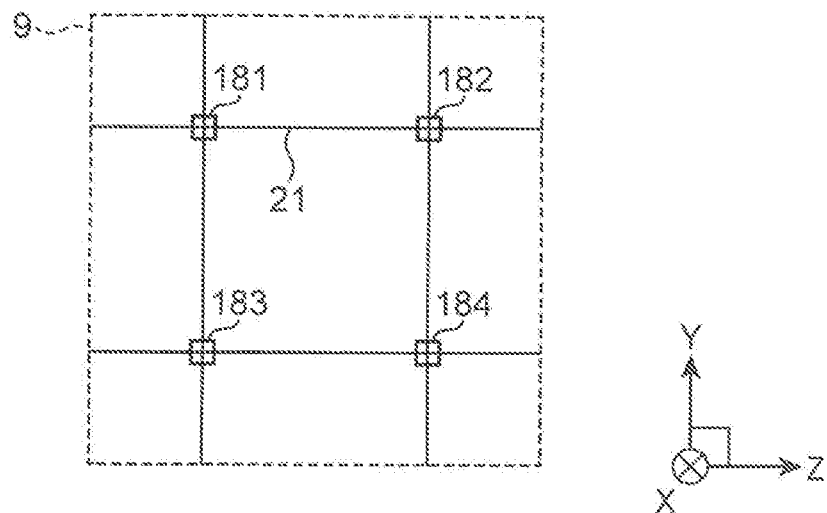
FIG. 5 is a view schematically showing an arrangement layout of a plurality of temperature sensors.

FIG. 5 is a view schematically showing the arrangement layout of the plurality of temperature sensors 18, and corresponds to a plan view in which a position along the line V-V shown in FIG. 1 is viewed in the X direction. The plurality of temperature sensors 18 are arranged in the same number and in the same layout as the plurality of blower fans 13. In the example of the present embodiment, a total of four temperature sensors 181 to 184 are arranged in a matrix of 2 rows×2 columns. Temperature data indicating the temperature measurement value output from each of the temperature sensors 181 to 184 is input to the control unit 30 described later. The temperature sensors 181 to 184 are arranged at each intersection of a grid-like frame 21 in which a plurality of rod-shaped members are cross-arrayed. This frame 21 is fixed to the inner wall of the test chamber 3 in proximity to the second wall surface 9. As shown in FIG. 1, each of the temperature sensors 181 to 184 are arranged on an extension line of the rotating shaft 15 of the corresponding blower fans 131 to 134.

Figure 6:
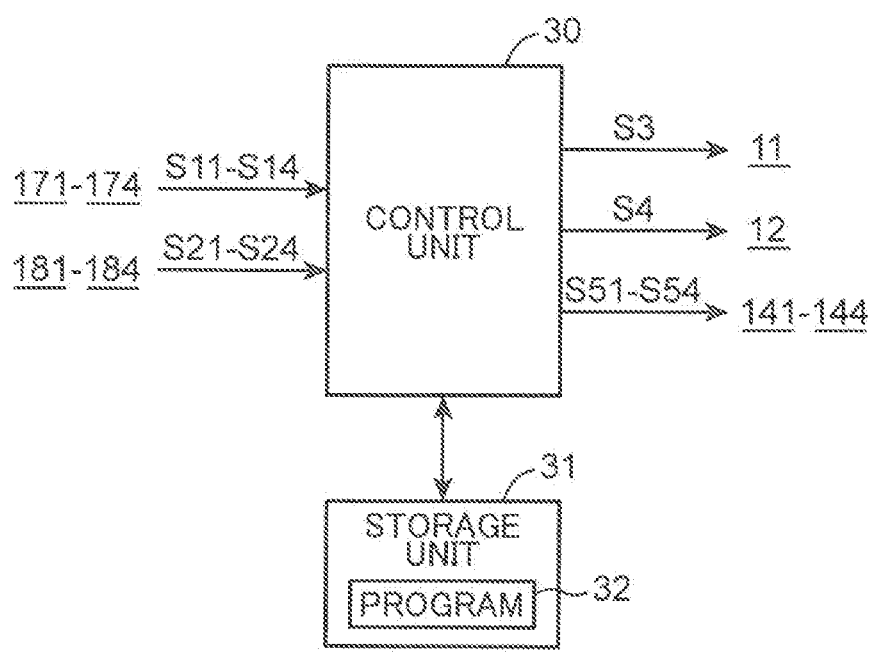
FIG. 6 is a view showing a control unit and a storage unit included in an environmental testing apparatus.

FIG. 6 is a view showing the control unit 30 and a storage unit 31 included in the environmental testing apparatus 1. The control unit 30 includes a CPU. The storage unit 31 includes an HDD, an SSD, or a semiconductor memory. The storage unit 31 stores a predetermined program 32 for causing a CPU as a computer that controls the environmental testing apparatus 1 to function as the control unit 30 (setting unit). The control unit 30 and the storage unit 31 may be mounted in the environmental testing apparatus 1 or may be externally connected to the environmental testing apparatus 1. The control unit 30 receives temperature data S11 to S14 from the temperature sensors 171 to 174, respectively. The control unit 30 receives temperature data S21 to S24 from the temperature sensors 181 to 184, respectively. The control unit 30 controls driving of the cooler 11 by a drive signal S3. The control unit 30 controls driving of the heater 12 by a drive signal S4. The control unit 30 individually controls the rotation speed of the blower fans 131 to 134 by individually controlling the output of the direct-current motors 141 to 144 by drive signals S51 to SM.

Operation of Apparatus

Figure 7:
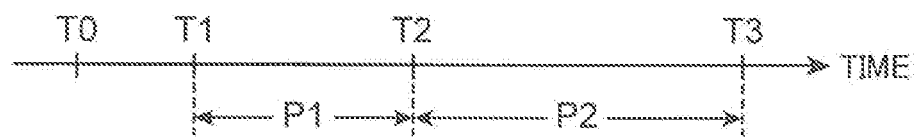
FIG. 7 is a timing chart simplistically showing a flow of an environmental testing by the environmental testing apparatus.

FIG. 7 is a timing chart simplistically showing the flow of an environmental testing by the environmental testing apparatus 1. The worker puts the test object 6 into the test chamber 3 at time T0, and then starts the operation of the environmental testing apparatus 1 by a button operation or the like at time T1. In a setting period P1 (times T1 to T2) before a testing period P2 (times T2 to T3) in which an environmental testing is executed, the control unit 30 executes setting processing for setting the rotation speed of each of the blower fans 131 to 134 in the testing period P2. As an example, the environmental testing is a constant temperature testing in which the setting temperature in the test chamber 3 is constant. The testing period P2 is several tens to several thousands of hours. The upper limit time of the setting period P1 is several tens of minutes to several hours. However, the lengths of the testing period P2 and the setting period P1 are not limited to the above example. The environmental testing is not limited to a constant temperature test in which the setting temperature is constant, and may be a test including a plurality of setting temperatures or a cycle test in which a high-temperature period and a low-temperature period are alternately repeated.

Figure 8:
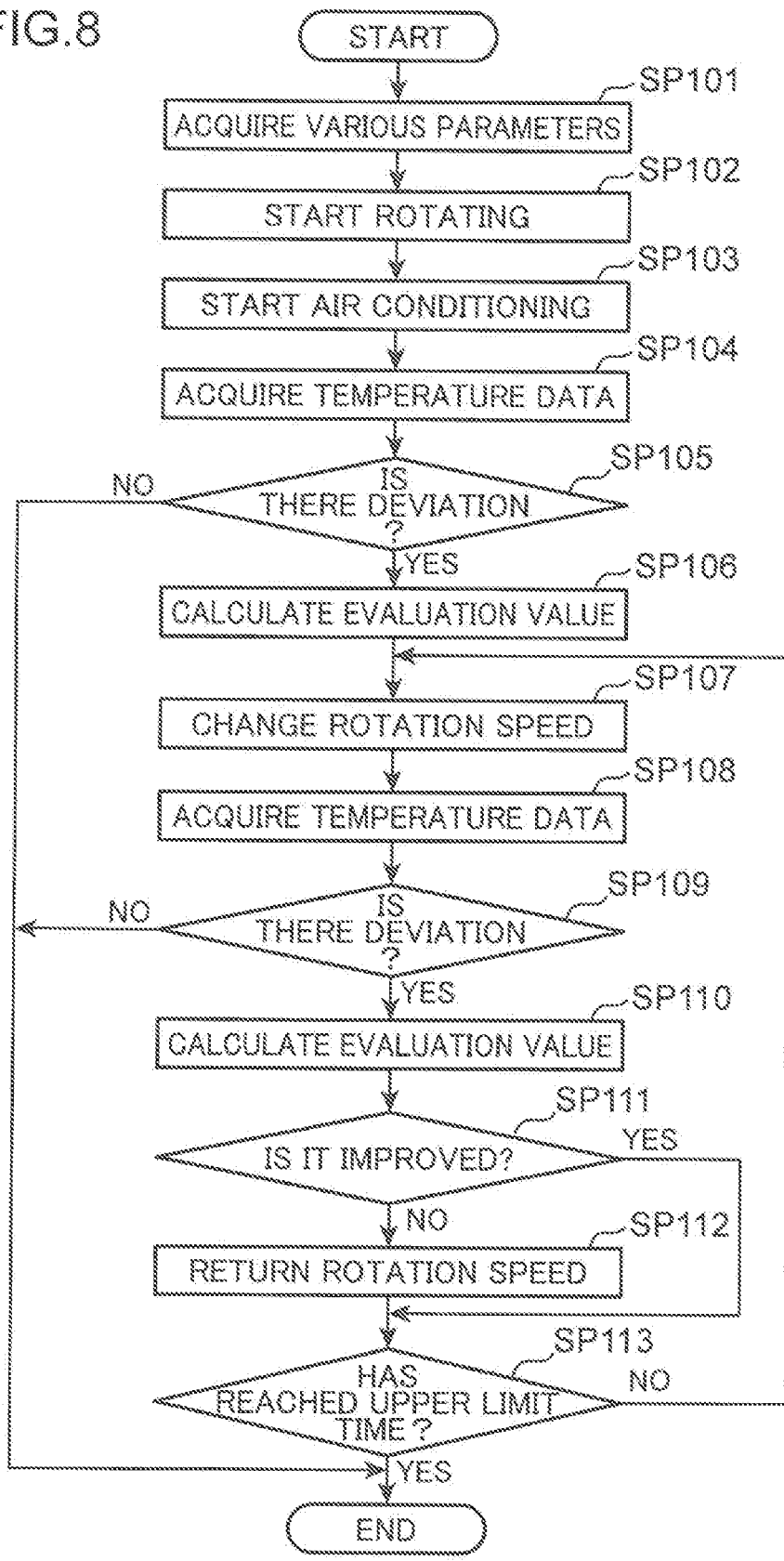
FIG. 8 is a flowchart showing a flow of setting processing executed by the control unit.

FIG. 8 is a flowchart showing the flow of setting processing executed by the control unit 30. In the initial state, driving of both the air-conditioning unit (the cooler 11 and the heater 12) and the blower fan 13 is stopped.

When an operation start command of the environmental testing apparatus 1 is input at the time T1, the control unit 30 acquires various parameters in step SP101. The various parameters include a target setting temperature of the test chamber 3, an allowable temperature range (upper limit temperature and lower limit temperature) in which a deviation is allowable with respect to the target setting temperature, an upper limit time of the setting period P1, and an upper limit value and a lower limit value of the rotation speed of the blower fans 131 to 134. The upper limit value and the lower limit value of the rotation speed are set based on the necessary amount or necessary efficiency of heat exchange in the air conditioning unit. These various parameters are input in advance, and setting information thereof is stored in the storage unit 31.

Next, in step SP102, by driving the direct-current motors 141 to 144 by the drive signals S51 to S54, the control unit 30 starts driving of the blower fans 131 to 134 at rotation speed of an initial value. The initial value of the rotation speed is set in advance for each of the blower fans 131 to 134, and the setting information thereof is stored in the storage unit 31.

Next, in step SP103, the control unit 30 starts driving of the cooler 11 or the heater 12 by the drive signals S3 and S4 based on the target setting temperature.

After waiting for a predetermined time (e.g., several tens of seconds to several minutes) for stabilizing the temperature in the test chamber 3, next, in step SP104, the control unit 30 acquires the temperature data S11 to S14 and S21 to S24 from the temperature sensors 171 to 174 and 181 to 184.

Next, in step SP105, the control unit 30 determines whether or not the temperature data S11 to S14 and S21 to S24 acquired in step SP104 contain temperature data deviating from the allowable temperature range for the target setting temperature.

When all the temperature data S11 to S14 and S21 to S24 are within the allowable temperature range (step SP105: NO), the control unit 30 sets the initial value of the rotation speed of each of the blower fans 131 to 134 as the rotation speed of each of the blower fans 131 to 134 in the testing period P2, and ends the setting processing.

When the temperature data S11 to S14 and S21 to S24 contain even one datum deviating from the allowable temperature range (step SP105: YES), next in step SP106, the control unit 30 calculates a predetermined evaluation value based on the temperature data S11 to S14 and S21 to S24 acquired in step SP104. This evaluation value is a derivation index whose value increases as the difference between the target setting temperature and the plurality of temperature data S11 to S14 and S21 to S24 increases. As the evaluation value, for example, a difference between the target value and a representative value (maximum value or minimum value) of a plurality of measurement data, a difference between the target value and a mean value of a plurality of measurement data, a sum of difference absolute values, a sum of square errors, or a mean square error can be used. As the evaluation value, a difference between a maximum value and a minimum value, a difference between a mean value and a representative value (maximum value or minimum value), a sum of difference absolute values, a variance, or a standard deviation, which are indices of variations of a plurality of measurement data, can also be used.

Next, in step SP107, the control unit 30 changes the rotation speed of the blower fans 131 to 134 within a range between the lower limit value and the upper limit value. The control unit 30 uses the current rotation speed (rotation speed before change) of each of the blower fans 131 to 134 as a reference value, and sets, as the changed rotation speed for each of the blower fans 131 to 134, a value obtained by increasing or decreasing a random change value for each of the blower fans 131 to 134 from each reference value. The change value is a random value selected from a range of plus or minus several hundred (rpm), for example.

After waiting for the predetermined time for the temperature in the test chamber 3 to stabilize, next, in step SP108, the control unit 30 acquires the temperature data S11 to S14 and S21 to S24 from the temperature sensors 171 to 174 and 181 to 184.

Next, in step SP109, the control unit 30 determines whether or not the temperature data S11 to S14 and S21 to S24 acquired in step SP108 contain temperature data deviating from the allowable temperature range for the target setting temperature.

When all the temperature data S11 to S14 and S21 to S24 are within the allowable temperature range (step SP109: NO), the control unit 30 sets the changed rotation speed set in step SP107 as the rotation speed of the blower fans 131 to 134 in the testing period P2, and ends the setting processing.

When the temperature data S11 to S14 and S21 to S24 contain even one datum deviating from the allowable temperature range (step SP109: YES), next in step SP110, the control unit 30 calculates an evaluation value as above based on the temperature data S11 to S14 and S21 to S24 acquired in step SP108.

Next, in step SP111, the control unit 30 compares the evaluation value (evaluation value before change) calculated in step SP106 with the evaluation value (evaluation value after change) calculated in step SP110, thereby determining whether or not the variation in temperature in the test chamber 3 has been improved.

When the evaluation value after change is equal to or greater than the evaluation value before change (step SP111: NO), the variation in temperature in the test chamber 3 is not improved even if the rotation speed of the blower fans 131 to 134 is changed. In this case, next, in step SP112, by not adopting the rotation speed changed in step SP107, the control unit 30 returns the rotation speed of each of the blower fans 131 to 134 to the value before change.

On the other hand, when the evaluation value after change is less than the evaluation value before change (step SP111: YES), the variation in temperature in the test chamber 3 is improved by changing the rotation speed of the blower fans 131 to 134. In this case, by adopting the rotation speed changed in step SP107, the control unit 30 maintains the changed value as the rotation speed of each of the blower fans 131 to 134.

Next, in step SP113, the control unit 30 determines whether or not the elapsed time from the time point (time T1) at which the execution of the setting processing is started has reached the upper limit time of the setting period P1.

In a case where the elapsed time has not reached the upper limit time (step SP113: NO), the control unit 30 repeatedly executes the processing of step SP107 and subsequent steps. In the subsequent step SP111, the control unit 30 compares the evaluation value (evaluation value before change) calculated in the previous step SP110 having been adopted with the evaluation value (evaluation value after change) calculated in the current step SP110 after change, thereby determining whether or not the variation in temperature in the test chamber 3 has been improved.

When the elapsed time has reached the upper limit time (step SP113: YES), the control unit 30 sets, as the rotation speed of each of the blower fans 131 to 134 in the testing period P2, the rotation speed (i.e., the rotation speed finally set in the setting period P1) of each of the blower fans 131 to 134 currently set, and ends the setting processing.

As the evaluation value, an evaluation value that decreases as the difference increases may be used. In this case, when the evaluation value after change is equal to or less than the evaluation value before change (step SP111: corresponding to NO), the variation in temperature in the test chamber 3 is not improved even if the rotation speed of the blower fans 131 to 134 is changed. In this case, next, in step SP112, by not adopting the rotation speed changed in step SP107, the control unit 30 returns the rotation speed of each of the blower fans 131 to 134 to the value before change. On the other hand, when the evaluation value after change exceeds the evaluation value before change (step SP111: corresponding to YES), the variation in temperature in the test chamber 3 is improved by changing the rotation speed of the blower fans 131 to 134. In this case, by adopting the rotation speed changed in step SP107, the control unit 30 maintains the changed value as the rotation speed of each of the blower fans 131 to 134.

It may be configured such that the temperature data before and after the change in the rotation speed are temporarily stored in an arbitrary storage unit, the control unit 30 acquires, from the storage unit, the temperature data before change and the temperature data after change, and adopts the rotation speed at which a better evaluation value is obtained by comparing the both temperature data. It may be configured such that the temperature data measured every time the rotation speed is changed is temporarily stored in an arbitrary storage unit, and the control unit 30 collectively acquires three or more temperature data in time series from the storage unit, and adopts the rotation speed at which the best evaluation value is obtained by comparing them.

Actions and Effects

According to the environmental testing apparatus 1 according to the present embodiment, in the setting processing, the control unit 30 (setting unit) changes the rotation speed of the plurality of blower fans 131 to 134 a plurality of times, and acquires a plurality of temperature data S11 to S14 and S21 to S24 (measurement values) after each change from the plurality of temperature sensors 171 to 174 and 181 to 184 (measurement units). Based on the result, the control unit 30 appropriately sets the rotation speed of each of the blower fans 131 to 134 in the testing period P2, so that it is possible to eliminate or reduce the variation in the temperature (environmental element) in the test chamber 3 (environment forming chamber).

According to the environmental testing apparatus 1 according to the present embodiment, the control unit 30 randomly decides the change value of the rotation speed when changing the rotation speed of the plurality of blower fans 131 to 134, so that the global optimal solution regarding the rotation speed of each of the blower fans 131 to 134 can be searched for by a simple algorithm.

According to the environmental testing apparatus 1 according to the present embodiment, the control unit 30 repeatedly executes the setting processing of adopting the change if the evaluation value decreases by the change of the rotation speed and not adopting the change if the evaluation value does not decrease by the change, so that the rotation speed of each blower fan is gradually changed toward the optimal value as the setting processing proceeds. As a result, the possibility that the optimal value of the rotation speed of each blower fan is found early increases.

According to the environmental testing apparatus 1 according to the present embodiment, the control unit 30 repeatedly executes the setting processing of increasing or decreasing the change value from the reference value with the current rotation speed as a reference value, so that the rotation speed of each of the blower fans 131 to 134 is gradually changed toward the optimal value as the setting processing proceeds. As a result, the possibility that the optimal value of the rotation speed of each of the blower fans 131 to 134 is found early increases.

According to the environmental testing apparatus 1 according to the present embodiment, the control unit 30 ends the setting processing if all of the plurality of temperature data S11 to S14 and S21 to S24 fall within the target range, so that the testing period P2 can be started early.

According to the environmental testing apparatus 1 according to the present embodiment, the control unit 30 ends the setting processing if the elapsed time of the setting period P1 reaches the upper limit time, so that it is possible to avoid a situation in which the start of the testing period P2 is excessively delayed.

Hereinafter, various modifications to the above embodiment will be described. These modifications can be applied in combination as appropriate.

First Modification

In the above embodiment, the control unit 30 adopts the change if the evaluation value of the rotation speed after change is less than the evaluation value before change, does not adopt the change if the evaluation value after change is equal to or greater than the evaluation value before change, and sets the rotation speed finally set in the setting period P1 as the rotation speed of each of the blower fans 131 to 134 in the testing period P2.

Not limited to this example, the control unit 30 may change the rotation speed of the blower fans 131 to 134 a plurality of times, record the evaluation value calculated after each change in the storage unit 31 (or an internal memory of the control unit 30), and set, as the rotation speed of each of the blower fans 131 to 134 in the testing period P2, the rotation speed of each of the blower fans 131 to 134 at which the minimum evaluation value among the plurality of recorded evaluation values is obtained.

According to the present modification, the control unit 30 executes the setting processing of changing the rotation speed of the blower fans 131 to 134 a plurality of times and recording the evaluation value after each change, so that it is possible to avoid a situation in which the setting processing falls into a search for a local optimal solution. As a result, it is more likely that a global optimal solution regarding the rotation speed of each of the blower fans 131 to 134 is found.

Second Modification

In the above embodiment, the control unit 30 adopts the changed rotation speed on condition that the variation in temperature in the test chamber 3 is improved by changing the rotation speed of the blower fans 131 to 134.

In addition to this, the control unit 30 may adopt the changed rotation speed on additional condition that the operating state of the environmental testing apparatus 1 after change of the rotation speed satisfies a predetermined safety standard. For example, regarding the temperature and pressure of a discharge pipe of a refrigeration circuit included in the air conditioning unit, a safety standard value slightly more relaxed than the limit value for forcibly stopping the operation of the environmental testing apparatus 1 is set in advance, and the setting information thereof is stored in the storage unit 31. The control unit 30 adopts the changed rotation speed on additional condition that the temperature value and pressure value of the discharge pipe measured after change of the rotation speed of the blower fans 131 to 134 satisfy the safety standard value.

According to the present modification, even if the rotation speed of the blower fans 131 to 134 after change is suitable from the viewpoint of reducing the variation in temperature, by not adopting the change when the reference value related to a predetermined operation parameter such as the safety standard is not satisfied, it is possible to avoid a situation in which the operation of the environmental testing apparatus 1 is forcibly stopped.

Third Modification

In the above embodiment, the control unit 30 ends the setting processing when the elapsed time from the start of the execution of the setting processing reaches the predetermined upper limit time. Not limited to this example, the control unit 30 may end the setting processing when the number of changes in rotation speed (the number of executions in step SP107) from the start of the execution of the setting processing reaches a predetermined upper limit number of times. The upper limit number of times is set to, for example, several ten times to several hundred times, and the setting information thereof is stored in the storage unit 31.

In the above exemplary embodiment, the control unit 30 uses temperature as an environmental element. Not limited to this example, the control unit 30 may use other environmental elements such as humidity or wind speed.

In the above embodiment, the control unit 30 ends the setting processing on condition that all the temperature data S11 to S14 and S21 to S24 acquired after change of the rotation speed fall within the allowable temperature range. Not limited to this example, the control unit 30 may end the setting processing on condition that the evaluation value calculated after change of the rotation speed is equal to or less than a predetermined threshold.

In the above embodiment, the initial value of the rotation speed is individually set for each of the blower fans 131 to 134. Not limited to this example, and an initial value common to all the blower fans 131 to 134 may be set.

In the above embodiment, the control unit 30 uses the current rotation speed of each of the blower fans 131 to 134 as a reference value. Not limited to this example, the control unit 30 may use an initial value of the rotation speed of each of the blower fans 131 to 134 as a reference value.

In the above embodiment, the control unit 30 sets, as the changed rotation speed, a value obtained by increasing or decreasing the change value from the reference value. Not limited to this example, the control unit 30 may set, as the changed rotation speed, a rotation speed randomly selected from a range between the lower limit value and the upper limit value.

As another modification, only one of the temperature sensor 17 and the temperature sensor 18 may be disposed in the test chamber 3. In addition to the temperature sensors 17 and 18, another temperature sensor may be disposed at a predetermined location in the test chamber 3 (e.g., center part of the test chamber 3). The temperature sensors 17 and 18 may be disposed at positions shifted from the extension line of the rotating shaft 15 of the corresponding blower fan 13. Alternatively, the air conditioning chamber 4 may be disposed at a location not adjacent to the test chamber 3, and the air conditioning chamber 4 and the test chamber 3 may be connected to each other by piping or the like. Instead of the configuration in which the blower fan 13 blows air-conditioned air from the air conditioning chamber 4 to the test chamber 3, the blower fan 13 may be configured to suck air-conditioned air from the test chamber 3 to the air conditioning chamber 4.

The present modification also achieves the same effects as those of the above embodiment.

Fourth Modification

In the above embodiment, the environmental testing apparatus 1 includes the total of four blower fans 131 to 134 arrayed in a matrix of 2 rows×2 columns, but the arrangement layout of the plurality of blower fans 13 is not limited to this example. The environmental testing apparatus 1 only needs to include at least two or more blower fans 13. For example, the environmental testing apparatus 1 may include a total of nine blower fans 13 arrayed in a matrix of 3 rows×3 columns, or may include a total of 16 blower fans 13 arrayed in a matrix of 4 rows×4 columns. The number of the plurality of blower fans 13 belonging to each row and the number of the plurality of blower fans 13 belonging to each column may be different from each other. Moreover, the plurality of blower fans 13 are not necessarily arranged in a matrix, and all the plurality of blower fans 13 are not necessarily the same in size. The present modification also achieves the same effects as those of the above embodiment.

Fifth Modification

In the above embodiment, an example in which the environment forming apparatus is configured as the environmental testing apparatus 1 has been described, but the present invention is not limited to this example. The environment forming apparatus may be configured as a heat treatment apparatus that forms a predetermined high-temperature environment in order to apply heat treatment to a workpiece that is an object. The environment forming apparatus may be configured as a cooking apparatus that forms a predetermined high-temperature environment in order to heat food that is an object. The present modification also achieves the same effects as those of the above embodiment.

Sixth Modification

Figure 9:
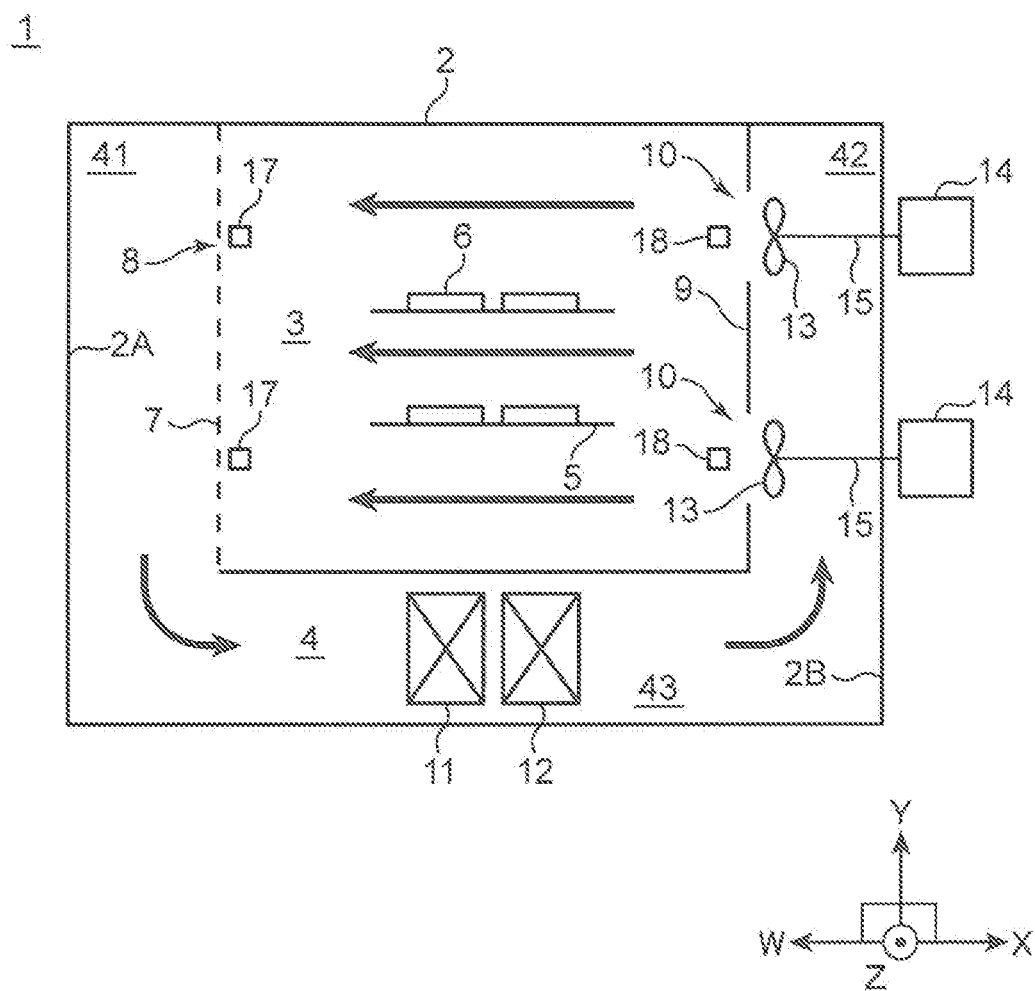
FIG. 9 is a view schematically showing a configuration of an environment forming apparatus according to a modification.
Figure 10:
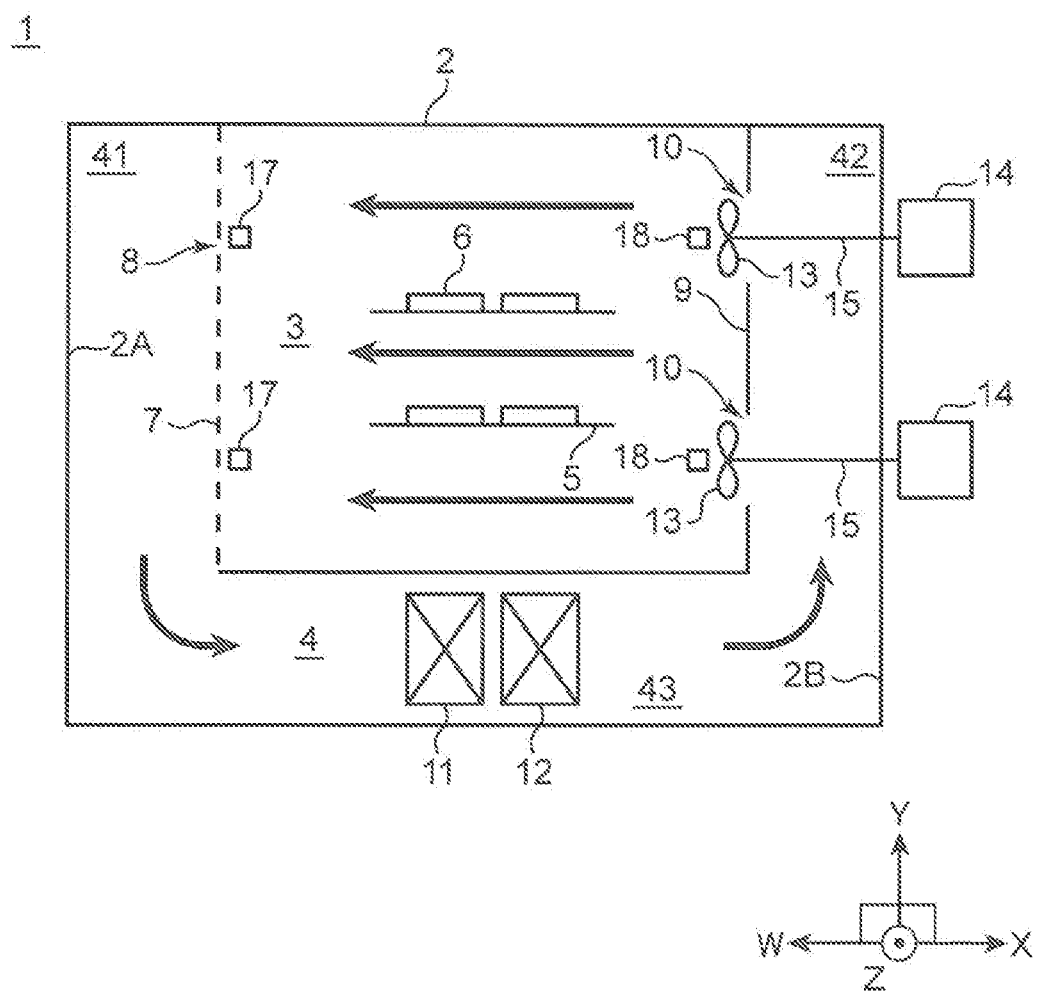
FIG. 10 is a view schematically showing a configuration of the environment forming apparatus according to the modification.

FIGS. 9 and 10 are views schematically showing the configuration of an environment forming apparatus according to a sixth modification. As shown in FIG. 9, the blades of the blower fan 13 may be arranged in the X direction (second space section 42 side) relative to the vents 10. As shown in FIG. 10, the blades of the blower fan 13 may be arranged in the W direction (test chamber 3 side) relative to the vents 10. The present modification also achieves the same effects as those of the above embodiment.

Seventh Modification

Figure 11:
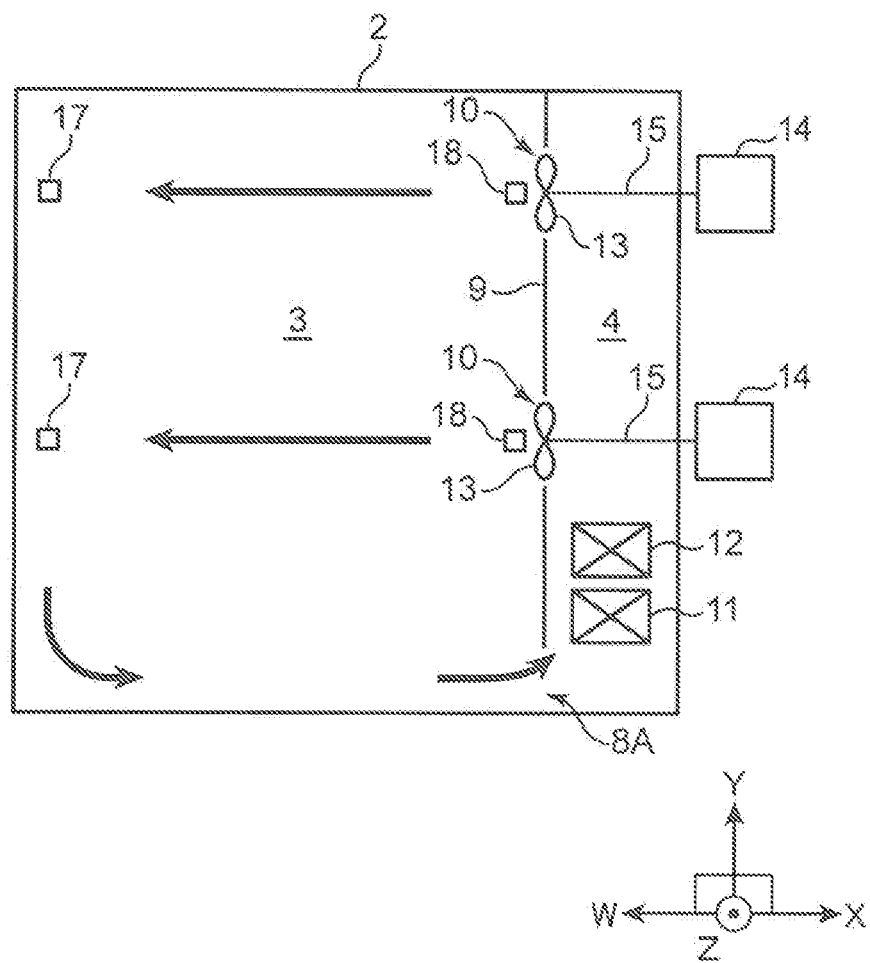
FIG. 11 is a view schematically showing a configuration of the environment forming apparatus according to the modification.

FIGS. 11 and 12 are views schematically showing the configuration of an environment forming apparatus according to a seventh modification. As shown in FIG. 11, it may be configured that the test chamber 3 does not have the first wall surface 7, the air conditioning chamber 4 does not have the first space section 41 and the connection space section 43, a vent 8A is formed in the lower part of the second wall surface 9, and the cooler 11 and the heater 12 are disposed in the lower part of the air conditioning chamber 4. As shown in FIG. 12, it may be configured that the test chamber 3 does not have the first wall surface 7, the air conditioning chamber 4 does not have the first space section 41 and the connection space section 43, vents 8B and 8C are formed in the upper part and the lower part of the second wall surface 9, respectively, and the cooler 11 and the heater 12 are disposed in the upper part and the lower part of the air conditioning chamber 4, respectively. The present modification also achieves the same effects as those of the above embodiment.

Eighth Modification

The air conditioning unit including the cooler 11 and the heater 12 and a blower unit including the blower fan 13 may be configured as an environment forming unit that can be attached to the test chamber 3 afterward.

In this case, an environment forming unit is an environment forming unit connected to an environment forming chamber in which an object to be processed is accommodated, the environment forming unit including: an air conditioning chamber that communicates with the environment forming chamber; an air conditioning unit that is disposed in the air conditioning chamber and generates air-conditioned air by adjusting an environmental element of air; a plurality of blower fans that circulate the air-conditioned air between the air conditioning chamber and the environment forming chamber; and a setting unit that is capable of individually setting rotation speed of each blower fan of the plurality of blower fans, in which the setting unit executes setting processing for setting rotation speed of the each blower fan in a processing period in a setting period before the processing period in which the processing is executed, and in the setting processing, the setting unit changes rotation speed of the plurality of blower fans a plurality of times and acquires a plurality of measurement values from a plurality of measurement units that measure the environmental element at a plurality of locations in an environment forming chamber after each change.

The present modification also achieves the same effects as those of the above embodiment.

Ninth Modification

In the above embodiment, the configuration in which the setting processing for setting the rotation speed of each of the blower fans 131 to 134 is executed when the operation of the environmental testing apparatus 1 is started has been described, but the present invention is not limited to this.

The setting processing may be executed when the environment of the test chamber 3 is restored in a case where the environment of the test chamber 3 is changed because the door of the test chamber 3 is opened for taking in and out the test object 6 during the test. In this case, the period during which the environment is restored and the test is executed is the testing period P2, and the setting processing period before this testing period P2 is the setting period P1. The present modification also achieves the same effects as those of the above embodiment.

An environment forming apparatus according to one aspect of the present invention includes: an environment forming chamber in which an object for which processing is to be executed is accommodated; an air conditioning chamber that communicates with the environment forming chamber; an air conditioning unit that is disposed in the air conditioning chamber and generates air-conditioned air by adjusting an environmental element of air; a plurality of blower fans that circulate the air-conditioned air between the air conditioning chamber and the environment forming chamber; a plurality of measurement units that measure the environmental element at a plurality of locations in the environment forming chamber and output a plurality of measurement values; and a setting unit that is capable of individually setting rotation speed of each blower fan of the plurality of blower fans, in which the setting unit changes rotation speed of the plurality of blower fans a plurality of times and acquires the plurality of measurement values after each change in a setting period before a processing period in which the processing is executed, and executes setting processing for setting rotation speed of the each blower fan in the processing period based on the plurality of measurement values.

According to the present aspect, in the setting processing, the setting unit changes the rotation speed of the plurality of blower fans a plurality of times, and acquires the plurality of measurement values after each change from the plurality of measurement units. When the setting unit appropriately sets the rotation speed of each blower fan in the processing period based on the result, it is possible to eliminate or reduce variations in environmental elements in the environment forming chamber.

In the above aspect, the setting unit randomly decides a change value of rotation speed when changing rotation speed of the plurality of blower fans.

According to the present aspect, the setting unit randomly decides the change value of the rotation speed when changing the rotation speed of the plurality of blower fans, so that the global optimal solution regarding the rotation speed of each blower fan can be searched for by a simple algorithm.

In the above aspect, the setting unit calculates an evaluation value fluctuating according to a difference between a target value of the environmental element and the plurality of measurement values or a variation in measurement values, adopts the change if the evaluation value after change of rotation speed of the plurality of blower fans is a value in which the difference or the variation is smaller than the difference or the variation of in evaluation value before change, and does not adopt the change if the evaluation value after change is same as the evaluation value before change or a value in which the difference or the variation is larger, and sets, as rotation speed of the each blower fan in the processing period, rotation speed of the each blower fan finally set in the setting period.

According to the present aspect, the setting unit repeatedly executes the setting processing of adopting the change if the difference or variation is reduced by the change of the rotation speed and not adopting the change if the difference or variation is not reduced by the change, so that the rotation speed of each blower fan is gradually changed toward the optimal value as the setting processing proceeds. As a result, the possibility that the optimal value of the rotation speed of each blower fan is found early increases.

In the above aspect, the setting unit calculates an evaluation value fluctuating according to a difference between a target value of the environmental element and the plurality of measurement values or a variation, changes rotation speed of the plurality of blower fans a plurality of times and records the evaluation value after each change, and sets, as rotation speed of the each blower fan in the processing period, rotation speed of the each blower fan at which an evaluation value having a minimum difference or variation, among a plurality of evaluation values having been recorded.

According to the present aspect, the setting unit executes the setting processing of changing the rotation speed of the plurality of blower fans a plurality of times and recording the evaluation value after each change, so that it is possible to avoid a situation in which the setting processing falls into a search for a local optimal solution. As a result, it is more likely that a global optimal solution regarding the rotation speed of each blower fan is found.

In the above aspect, the setting unit decides whether to adopt change based on a predetermined operation parameter of the environment forming apparatus after change in rotation speed of the plurality of blower fans and a predetermined reference value related to the operation parameter.

According to the present aspect, even if the rotation speed of the blower fan after change is suitable from the viewpoint of reducing the variation in an environmental element, by not adopting the change when the reference value related to a predetermined operation parameter such as the safety standard is not satisfied, it is possible to avoid a situation in which the operation of the environment forming apparatus is forcibly stopped.

In the above aspect, the setting unit sets rotation speed of next time of the each blower fan with current rotation speed of the each blower fan as a reference value and as a value obtained by increasing or decreasing a change value of rotation speed from the reference value.

According to the present aspect, the setting unit repeatedly executes the setting processing of increasing or decreasing the change value from the reference value with the current rotation speed as a reference value, so that the rotation speed of each blower fan is gradually changed toward the optimal value as the setting processing proceeds. As a result, the possibility that the optimal value of the rotation speed of each blower fan is found early increases.

In the above aspect, the setting unit ends the setting processing when all of the plurality of measurement values fall within a predetermined target range of the environmental element.

According to the present aspect, the processing period can be started early when the setting unit ends the setting processing if all of the plurality of measured values fall within the target range.

In the above aspect, the setting unit ends the setting processing when elapsed time from start of execution of the setting processing or the number of changes of rotation speed reaches a predetermined upper limit value.

According to the present aspect, since the setting unit ends the setting processing when the elapsed time or the number of changes of the rotation speed reaches the upper limit value, it is possible to avoid a situation in which the start of the processing period is excessively delayed.

In the above aspect, a lower limit value and an upper limit value of rotation speed of the plurality of blower fans are set in advance, and the setting unit changes rotation speed of the plurality of blower fans within a range between the lower limit value and the upper limit value.

According to the present aspect, in the setting processing, the setting unit changes the rotation speed within the range between the lower limit value and the upper limit value, so that it is possible to avoid a situation in which the rotation speed is set to excessively low speed or excessively high speed.

A program according to one aspect of the present invention is a program for causing a computer to function as a setting unit, the computer that controls an environment forming apparatus including an environment forming chamber in which an object for which processing is to be executed is accommodated, an air conditioning chamber that communicates with the environment forming chamber, an air conditioning unit that is disposed in the air conditioning chamber and generates air-conditioned air by adjusting an environmental element of air, a plurality of blower fans that circulate the air-conditioned air between the air conditioning chamber and the environment forming chamber, and a plurality of measurement units that measure the environmental element at a plurality of locations in the environment forming chamber and output a plurality of measurement values, in which the setting unit is capable of individually setting rotation speed of each blower fan of the plurality of blower fans, changes rotation speed of the plurality of blower fans a plurality of times and acquires the plurality of measurement values after each change in a setting period before a processing period in which the processing is executed, and executes setting processing for setting rotation speed of the each blower fan in the processing period based on the plurality of measurement values.

According to the present aspect, in the setting processing, the setting unit changes the rotation speed of the plurality of blower fans a plurality of times, and acquires the plurality of measurement values after each change from the plurality of measurement units. When the setting unit appropriately sets the rotation speed of each blower fan in the processing period based on the result, it is possible to eliminate or reduce variations in environmental elements in the environment forming chamber.

A method for controlling a blower fan according to one aspect of the present invention is a method for controlling a blower fan in an environment forming apparatus including an environment forming chamber in which an object for which processing is to be executed is accommodated, an air conditioning chamber that communicates with the environment forming chamber, an air conditioning unit that is disposed in the air conditioning chamber and generates air-conditioned air by adjusting an environmental element of air, a plurality of blower fans that circulate the air-conditioned air between the air conditioning chamber and the environment forming chamber, a plurality of measurement units that measure the environmental element at a plurality of locations in the environment forming chamber and output a plurality of measurement values; and a setting unit that is capable of individually setting rotation speed of each blower fan of the plurality of blower fans, in which the setting unit changes rotation speed of the plurality of blower fans a plurality of times and acquires the plurality of measurement values after each change in a setting period before a processing period in which the processing is executed, and executes setting processing for setting rotation speed of the each blower fan in the processing period based on the plurality of measurement values.

According to the present aspect, in the setting processing, the setting unit changes the rotation speed of the plurality of blower fans a plurality of times, and acquires the plurality of measurement values after each change from the plurality of measurement units. When the setting unit appropriately sets the rotation speed of each blower fan in the processing period based on the result, it is possible to eliminate or reduce variations in environmental elements in the environment forming chamber.

While the invention has been described in detail, the foregoing description is in all aspects illustrative and not restrictive. It is understood that numerous other modifications and variations can be devised without departing from the scope of the invention.

What is claimed is:

1. An environment forming apparatus comprising:
   an environment forming chamber in which an object for which processing is to be executed is accommodated;
   an air conditioning chamber that communicates with the environment forming chamber;
   an air conditioning unit that is disposed in the air conditioning chamber and generates air-conditioned air by adjusting an environmental element of air;
   a plurality of blower fans that circulate the air-conditioned air between the air conditioning chamber and the environment forming chamber;
   a plurality of measurement units that measure the environmental element at a plurality of locations in the environment forming chamber and output a plurality of measurement values; and
   a setting unit that is capable of individually setting rotation speed of each blower fan of the plurality of blower fans,
   wherein the setting unit
   changes rotation speed of the plurality of blower fans a plurality of times and acquires the plurality of measurement values after each change in a setting period before a processing period in which the processing is executed, and
   executes setting processing for setting rotation speed of the each blower fan in the processing period based on the plurality of measurement values.

2. The environment forming apparatus according to claim 1, wherein
   the setting unit randomly decides a change value of rotation speed when changing rotation speed of the plurality of blower fans.

3. The environment forming apparatus according to claim 1, wherein
   the setting unit
   calculates an evaluation value fluctuating according to a difference between a target value of the environmental element and the plurality of measurement values or a variation in measurement values,
   adopts the change if the evaluation value after change of rotation speed of the plurality of blower fans is a value in which the difference or the variation is smaller than the difference or the variation of in evaluation value before change, and does not adopt the change if the evaluation value after change is same as the evaluation value before change or a value in which the difference or the variation is larger, and sets, as rotation speed of the each blower fan in the processing period, rotation speed of the each blower fan finally set in the setting period.

4. The environment forming apparatus according to claim 1, wherein
the setting unit
calculates an evaluation value fluctuating according to a difference between a target value of the environmental element and the plurality of measurement values or a variation in measurement values,
changes rotation speed of the plurality of blower fans a plurality of times and records the evaluation value after each change, and
sets, as rotation speed of the each blower fan in the processing period, rotation speed of the each blower fan at which an evaluation value having a minimum difference or variation in measurement values, among a plurality of evaluation values having been recorded.

5. The environment forming apparatus according to claim 1, wherein
the setting unit decides whether to adopt change based on a predetermined operation parameter of the environment forming apparatus after change in rotation speed of the plurality of blower fans and a predetermined reference value related to the operation parameter.

6. The environment forming apparatus according to claim 1, wherein
the setting unit sets rotation speed of next time of the each blower fan with current rotation speed of the each blower fan as a reference value and as a value obtained by increasing or decreasing a change value of rotation speed from the reference value.

7. The environment forming apparatus according to claim 1, wherein
the setting unit ends the setting processing when all of the plurality of measurement values fall within a predetermined target range of the environmental element.

8. The environment forming apparatus according to claim 1, wherein
the setting unit ends the setting processing when elapsed time from start of execution of the setting processing or a number of changes of rotation speed reaches a predetermined upper limit value.

9. The environment forming apparatus according to claim 1, wherein
a lower limit value and an upper limit value of rotation speed of the plurality of blower fans are set in advance, and
the setting unit changes rotation speed of the plurality of blower fans within a range between the lower limit value and the upper limit value.

10. A computer-readable recording medium recording a program for causing a computer to function as a setting unit, the computer that controls an environment forming apparatus including an environment forming chamber in which an object for which processing is to be executed is accommodated, an air conditioning chamber that communicates with the environment forming chamber, an air conditioning unit that is disposed in the air conditioning chamber and generates air-conditioned air by adjusting an environmental element of air, a plurality of blower fans that circulate the air-conditioned air between the air conditioning chamber and the environment forming chamber, and a plurality of measurement units that measure the environmental element at a plurality of locations in the environment forming chamber and output a plurality of measurement values,
wherein the setting unit
is capable of individually setting rotation speed of each blower fan of the plurality of blower fans,
changes rotation speed of the plurality of blower fans a plurality of times and acquires the plurality of measurement values after each change in a setting period before a processing period in which the processing is executed, and
executes setting processing for setting rotation speed of the each blower fan in the processing period based on the plurality of measurement values having been acquired.

11. A method for controlling a blower fan in an environment forming apparatus including an environment forming chamber in which an object for which processing is to be executed is accommodated, an air conditioning chamber that communicates with the environment forming chamber, an air conditioning unit that is disposed in the air conditioning chamber and generates air-conditioned air by adjusting an environmental element of air, a plurality of blower fans that circulate the air-conditioned air between the air conditioning chamber and the environment forming chamber, a plurality of measurement units that measure the environmental element at a plurality of locations in the environment forming chamber and output a plurality of measurement values; and a setting unit that is capable of individually setting rotation speed of each blower fan of the plurality of blower fans,
wherein the setting unit
changes rotation speed of the plurality of blower fans a plurality of times and acquires the plurality of measurement values after each change in a setting period before a processing period in which the processing is executed, and
executes setting processing for setting rotation speed of the each blower fan in the processing period based on the plurality of measurement values having been acquired.

* * * * *